(12) United States Patent
Ahn et al.

(10) Patent No.: US 11,049,759 B2
(45) Date of Patent: Jun. 29, 2021

(54) MICRO LED TRANSFER HEAD

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/447,852

(22) Filed: Jun. 20, 2019

(65) Prior Publication Data
US 2020/0006110 A1 Jan. 2, 2020

(30) Foreign Application Priority Data

Jun. 27, 2018 (KR) .................. 10-2018-0074131
Jun. 27, 2018 (KR) .................. 10-2018-0074135

(51) Int. Cl.
*H01L 21/683* (2006.01)
*H01L 33/00* (2010.01)
*B25J 15/06* (2006.01)

(52) U.S. Cl.
CPC ...... *H01L 21/6838* (2013.01); *H01L 33/0095* (2013.01); *B25J 15/0691* (2013.01)

(58) Field of Classification Search
CPC ............. H01L 21/6838; B25J 15/0616; B25J 15/0691; B66C 1/0237; B66C 1/025
USPC ...................................................... 294/188
See application file for complete search history.

(56) References Cited

U.S. PATENT DOCUMENTS

| | | | | |
|---|---|---|---|---|
| 3,640,562 A | * | 2/1972 | Creskoff | B66C 1/0281 294/65 |
| 4,389,064 A | * | 6/1983 | Laverriere | B66C 1/025 209/905 |
| 5,749,614 A | * | 5/1998 | Reid | B65G 47/91 414/627 |
| 6,510,977 B1 | * | 1/2003 | Hertz | B23K 3/0623 228/180.22 |
| 8,960,749 B2 | * | 2/2015 | Fukano | H01L 21/6838 294/188 |
| 9,403,280 B2 | * | 8/2016 | Regan | B25B 11/007 |
| 10,615,064 B2 | * | 4/2020 | Ahn | B25J 15/0616 |
| 2003/0164620 A1 | * | 9/2003 | Schmalz | B66C 1/025 294/188 |
| 2017/0167025 A1 | * | 6/2017 | Ahn | B01D 67/0065 |
| 2018/0096878 A1 | * | 4/2018 | Wu | H01L 21/6838 |
| 2018/0158706 A1 | * | 6/2018 | Hsu | G01R 31/2887 |

(Continued)

FOREIGN PATENT DOCUMENTS

| KR | 100731673 B1 | 6/2007 |
|---|---|---|
| KR | 20140112486 A | 9/2014 |
| KR | 20170019415 A | 2/2017 |

(Continued)

*Primary Examiner* — Dean J Kramer

(57) ABSTRACT

The present invention relates to a micro LED transfer head transferring micro LEDs from a first substrate to a second substrate. According to the present invention, vacuum pressure of a grip region where the micro LEDs are gripped is uniformized, so that the micro LED transfer head transfers the micro LEDs efficiently. In addition, the vacuum pressure is distributed over a grip surface where the micro LEDs are gripped, thereby improving efficiency of transferring the micro LEDs.

7 Claims, 9 Drawing Sheets

(56) References Cited

U.S. PATENT DOCUMENTS

2019/0080954 A1* 3/2019 Kim .......................... G06T 7/73

FOREIGN PATENT DOCUMENTS

| KR | 20170024906 A | 3/2017 |
|---|---|---|
| KR | 20170026959 A | 3/2017 |
| KR | 101754528 B1 | 7/2017 |
| KR | 101757404 B1 | 7/2017 |

* cited by examiner

MICRO LED TRANSFER HEAD

CROSS REFERENCE TO RELATED APPLICATION

The present application claims priority to Korean Patent Applications Nos. 10-2018-0074131 and 10-2018-0074135, filed Jun. 27, 2018, the entire contents of which is incorporated herein for all purposes by this reference.

BACKGROUND OF THE INVENTION

Field of the Invention

The present invention relates to a micro LED transfer head transferring a micro light-emitting diode (micro LED) from a first substrate to a second substrate.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or flexible device using a micro LED device, and techniques of transferring micrometer-sized LED chips and mounting the LED chips on a display pixel electrode are required.

Particularly, with regard to the transfer of the micro LED device to a display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). According to the Related Art 3, there is no damage to micro LEDs as compared with the above-mentioned electrostatic head. However, an adhesive force of the elastic transfer head is required to be higher than that of a target substrate in the transfer process to transfer micro LEDs stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and micro LEDs may be damaged when pressed with the roller.

Samsung Display Co., Ltd proposed a method of transferring a micro-LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since micro LEDs are immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that an additional process of applying a bonding material having an adhesive force to bonding surfaces of the pick-up heads is required to transfer micro LEDs.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

Documents of Related Art (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention is to provide a micro LED transfer head uniformizing vacuum pressure in a grip region on which micro LEDs are gripped, thereby improving efficiency of transferring the micro LEDs.

Another objective of the present invention is to provide a micro LED transfer head uniformly forming vacuum pressure that generates a grip force of a grip surface on which micro LEDs are gripped, thereby improving efficiency of transferring the micro LEDs.

In order to achieve the above objective, there is provided a micro LED transfer head including: a grip member provided with a supporting portion on an upper surface of a non-grip region thereof where a micro LED is not gripped and with a vacuum pressure forming portion delivering vacuum pressure of a suction chamber via an air passage defined by the supporting portion.

The vacuum pressure forming portion may be provided with a suction hole.

The micro LED transfer head may further include: a porous member having pores, the porous member positioned on and coupled to the grip member via the supporting portion.

The micro LED transfer head may further include: a support plate positioned on and coupled to the grip member via the supporting portion, and provided with a suction passage.

The grip member may be a porous grip member.

The grip member may be a porous grip member having disordered pores.

The grip member may be a porous grip member having vertical pores.

The grip member may be an anodic oxide film formed by anodizing a metal.

In order to achieve another objective of the present invention, there is provided a micro LED transfer head including: a grip member gripping a micro LED; a support member provided on an upper surface of a non-grip region of the grip member; and a communication member positioned on and coupled to the support member and allowing regions defined by the support member to communicate with each other.

The communication member may be provided with a recess in a lower surface thereof, the recess crossing the support member.

The communication member may be a porous member having pores.

The grip member may be a porous grip member having vertical pores.

The grip member may be an anodic oxide film formed by anodizing a metal.

The communication portion may be provided with a suction hole.

The communication member may be coupled at an upper portion thereof to a vacuum chamber.

As described above, vacuum pressure that generates a grip force for gripping micro LEDs is uniformly distributed over an entire surface of a grip member gripping the micro LEDs, so that the micro LED transfer head can transfer the micro LEDs efficiently.

In addition, regions where the vacuum pressure that generates the grip force gripping the micro LEDs is delivered communicate with each other such that a uniform vacuum pressure can be formed in the grip region. Thus, the micro LED transfer head according to the present invention can transfer the micro LEDs efficiently.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
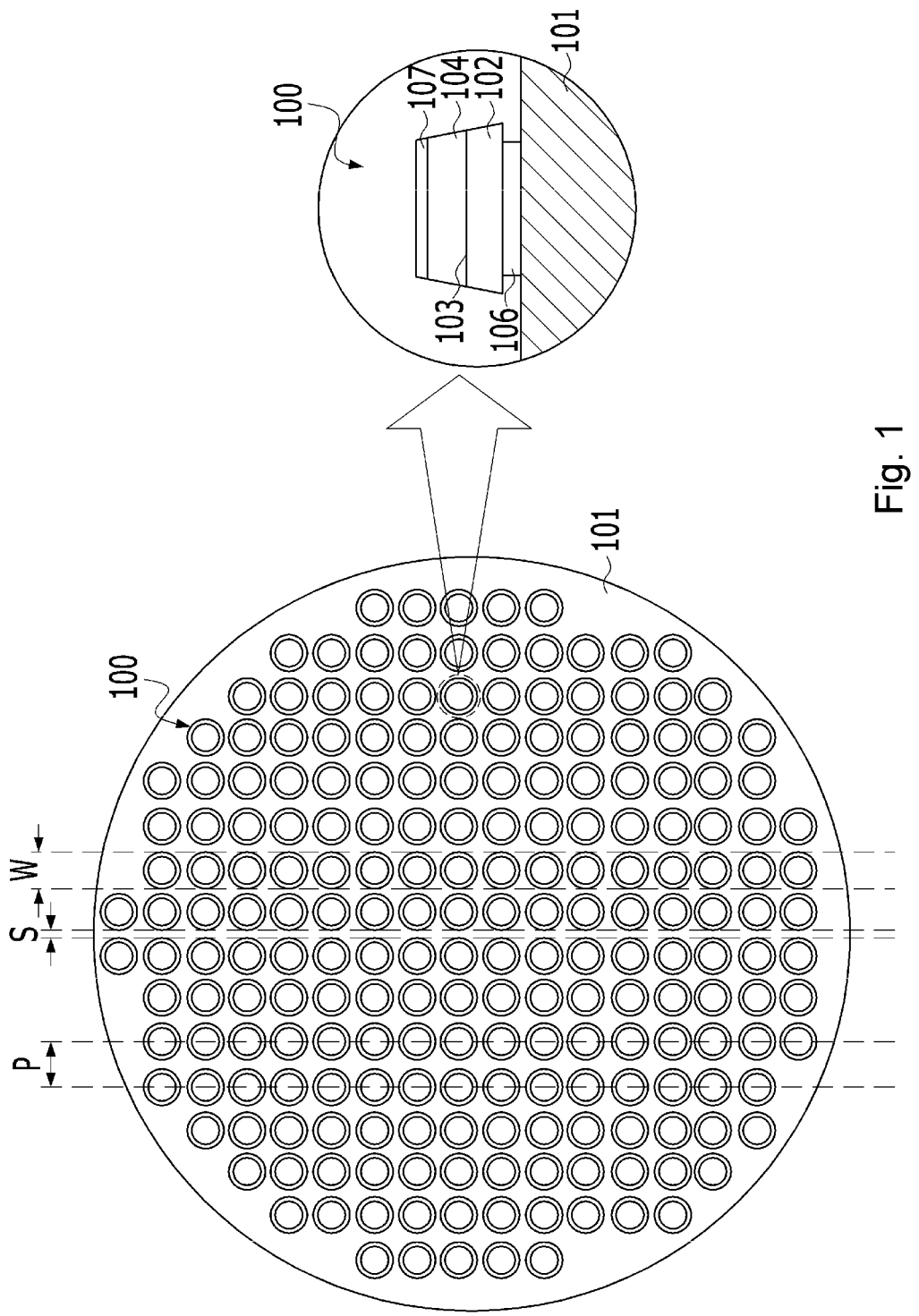
FIG. 1 is a view illustrating micro LEDs to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

First Embodiment

Hereinafter, a first embodiment of the present invention will be described in detail with reference to the accompanying drawings.

FIG. 1 is a view illustrating multiple micro LEDs 100 to be transferred by a micro LED transfer head according to the first embodiment of the present invention. The micro LEDs 100 are fabricated and disposed on a growth substrate 101.

The growth substrate 101 may be formed into a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100. Although FIG. 1 illustrates that each cross section of the micro LEDs 100 is circular, a cross section of the micro LEDs is not limited thereto. The micro LEDs 100 may have another cross section shape according to a method of fabricating the growth substrate 101 other than the circular cross section. For example, the micro LEDs 100 may have a rectangular cross-section. In the following drawings, the cross section of the micro LEDs 100 is quadrangular for the sake of convenience.

Figure 2:
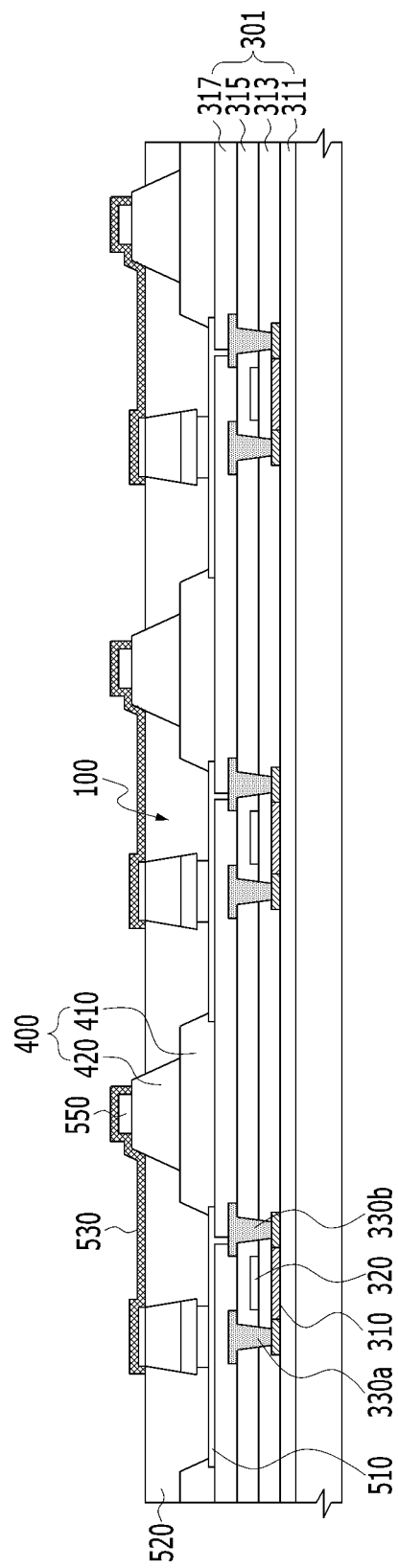
FIG. 2 is a view illustrating a micro LED structure in which the micro LEDs are transferred and mounted to a display substrate according to an embodiment of the present invention.

FIG. 2 is a view illustrating a micro LED structure in which the micro LEDs are transferred and mounted to a display substrate by the micro LED transfer head according to the embodiment of the present invention.

A display substrate 301 may include various materials. For example, the display substrate 301 may be made of a transparent glass material having $SiO_2$ as a main component. However, materials of the display substrate 301 are not limited to this, and the display substrate 301 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not required to be made of a transparent material. In this case, the display substrate 301 may be made of metal.

In the case of forming the display substrate 301 using metal, the display substrate 301 may be made of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a, the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides; poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross section shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 301 such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin; a thermosetting plastic such as epoxy resin, phenolic resin, urethane resin, acrylic resin, vinyl ester resin, polyimide resin, urea resin, and melamine resin; or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. In an alternate embodiment, the first bank layer 410 and the second bank layer 420 may be a distributed Bragg reflector (DBR) having high reflectivity or a mirror reflector made of metal.

Each of the micro LEDs 100 is disposed in each recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the display substrate 301, and received in the recess of the display substrate 301.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

Hereinbelow, a micro LED transfer head 1000 according to the first embodiment of the present invention will be described with reference to FIGS. 3 to 5.

Figure 3:
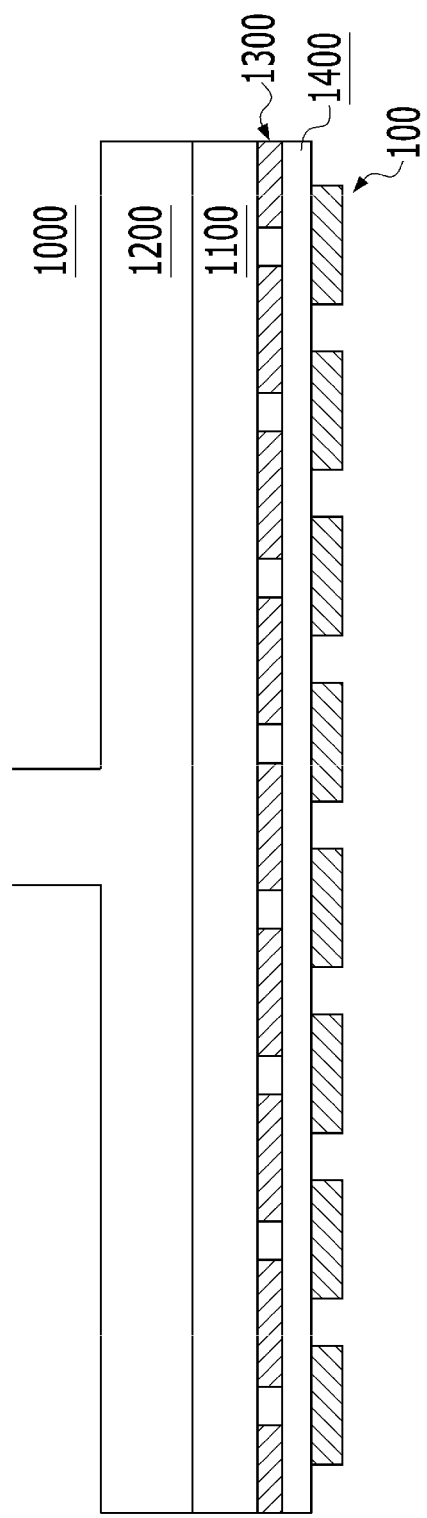
FIG. 3 is a view of a micro LED transfer head according to a first embodiment of the present invention.
Figure 4:
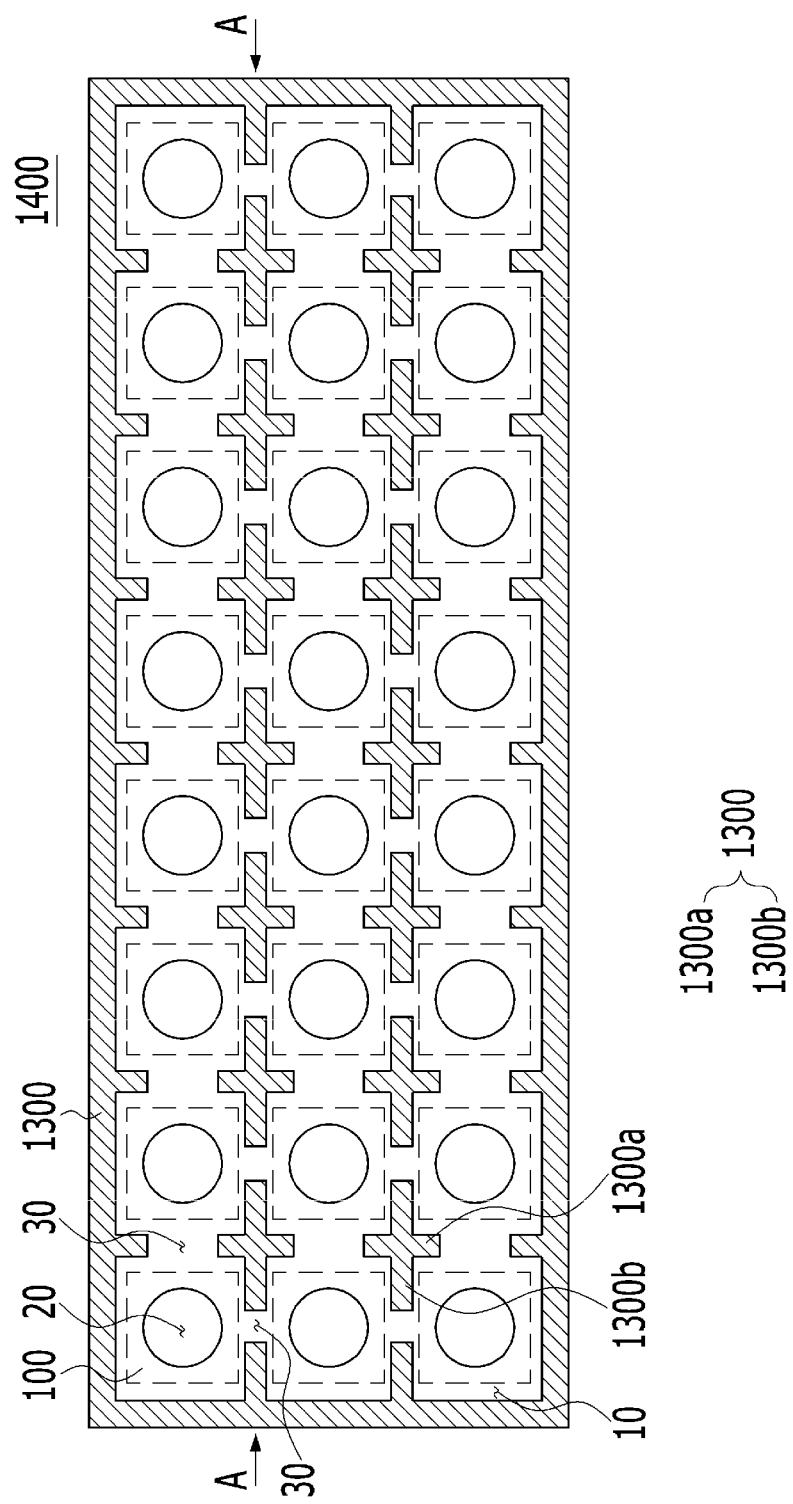
FIG. 4 is a top view illustrating a grip member of the micro LED transfer head according to the first embodiment of the present invention.

FIG. 3 is a cross-sectional view illustrating a structure of the micro LED transfer head 1000 according to the first embodiment of the present invention, the structure being configured such that a porous member 1100 and a suction chamber 1200 are coupled to each other at an upper portion of a cross section defined by being taken along an A-A line of FIG. 4 which is a top view illustrating a grip member 1400 of the micro LED transfer head 1000 according to the first embodiment of the present invention. The micro LED transfer head 1000 according to the first embodiment of the present invention includes: the grip member 1400 gripping the micro LEDs 100 onto a grip surface; the porous member 1100 positioned on and coupled to the grip member 1400; and the suction chamber 1200 positioned on and coupled to the porous member 1100 to apply vacuum pressure to pores of the porous member 1100. The micro LED transfer head 1000 transfers the micro LEDs 100 to a second substrate (for example, the display substrate 301) from a first substrate (for example, the growth substrate 101).

The micro LED transfer head 1000 uses a suction force to grip or detach the micro LEDs 100. Here, the micro LEDs may be gripped onto or detached from the grip member 1400 having the grip surface.

The grip member 1400 may be embodied by a porous grip member. The grip member 1400 is configured such that the porous grip member having pores serves as the grip surface such that the vacuum pressure is applied to the pores of the grip member 1400 and the micro LEDs 100 are gripped by vacuum suction force. The grip member 1400 may be embodied by a porous grip member having a disordered pore structure. In the case of the porous grip member having a disordered pore structure, the multiple pores are connected to each other inside the porous grip member such that air flow paths are formed and connect upper and lower portions of the porous grip member. Alternatively, the grip member 1400 may be embodied by a porous grip member having vertical pores. In the case of the porous grip member having the vertical pores, the vertical pores may be formed by laser, etching, or the like. The inside of the porous grip member having the vertical pores is pierced from top to bottom by the vertical pores such that air flow paths are formed.

Alternatively, the grip member 1400 may be embodied by an anodic oxide film formed by anodizing a metal. In the anodic oxide film, pores are arranged regularly. The anodic oxide film is a film formed by anodizing a metal that is a base material, and the pores are formed in a process of forming the anodic oxide film by anodizing the metal. For example, in a case that the base metal is aluminum (Al) or an aluminum alloy, the anodization of the base material forms the anodic oxide film consisting of anodized aluminum ($Al_2O_3$) on a surface of the base material. The anodic oxide film formed as described above includes a barrier layer in which pores are not formed and a porous layer in which the pores are formed inside. The barrier layer is positioned on an upper portion of the base material, and the porous layer is positioned on the barrier layer. After removing the base material on which the anodic oxide film having the barrier layer and the porous layer is formed, only an anodic oxide film consisting of anodized aluminum ($Al_2O_3$) remains.

The anodic oxide film has the pores configured vertically and having a regular arrangement with a uniform diameter. Accordingly, after removing the barrier layer, the pores have a structure extending from top to bottom vertically, thereby facilitating the generation of the vacuum pressure in the vertical direction.

The inside of the anodic oxide film forms air flow paths vertically by the vertical pores. An internal width of the pores has a size of several nanometers to several hundred nanometers. For example, when a size of the micro LED 100 to be vacuum-sucked is 30 μm×30 μm and an internal width of the pores is several nanometers, it is possible to vacuum-suck the micro LEDs 100 by approximately tens of millions of pores. The micro LEDs 100 are lightweight because each of the micro LEDs 100 are fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to grip the micro LEDs 100 by tens of thousands to tens of millions of pores formed in the anodic oxide film by vacuum-suction.

In addition to the anodic oxide film, the grip member 1400 may be embodied by a porous grip member made of a metal, a resin, a semiconductor substrate (for example, silicon or sapphire), quartz, or the like, and having disordered pores or vertical pores.

The porous member includes a grip region gripping the micro LEDs 100 and a non-grip region not gripping the micro LEDs 100. The grip region is a region where the vacuum pressure of the suction chamber 1200 is applied and grips the micro LEDs 100. The non-grip region is a region where the vacuum pressure of the suction chamber 1200 is not applied and thus does not grip the micro LEDs 100. The grip member 1400 includes vacuum pressure forming portions 10 provided on an upper surface of the grip member 1400 and through which the vacuum pressure of the suction chamber 1200 is transferred. The vacuum pressure applied to the porous member 1100 in the suction chamber 1200 is transferred to form vacuum pressure in the vacuum pressure forming portions 10. As a result, a grip force is generated in the grip region and the micro LEDs 100 are gripped thereby. The micro LEDs 100 can be gripped onto the grip region of the grip surface where the grip force is generated due to the vacuum pressure transferred to the vacuum pressure forming portions 10.

As illustrated in FIG. 3, supporting portions 1300 are provided on an upper surface of the non-grip region where the micro LEDs 100 are not gripped. The supporting portions 1300 provided on the upper surface of the non-grip region of the grip member 1400 support the weight of the porous member 1100 and the suction chamber 1200, which will be described later and positioned on and coupled to the grip member 1400.

FIG. 4 is a top view illustrating the grip member 1400 of the micro LED transfer head 1000 of the present invention. For easy explanation of the grip member 1400, FIG. 4 illustrates the supporting portions 1300, the vacuum pressure forming portions 10, the micro LEDs 100, or the like in an enlarged manner. As illustrated in FIG. 4, the supporting portions 1300 are provided on the upper surface of the non-grip region of the grip member 1400 and may be configured such that an outer periphery is formed in an extended manner and multiple rows and columns are arranged in the inner side surrounded by the outer periphery. The inner supporting portions 1300 may be formed into a cross shape by intersecting column supporting portions 1300a and row supporting portions 1300b. Here, the outer periphery may indicate a region of the upper surface of the grip member 1400, which corresponds to an outer portion of a micro LED present area where the multiple micro LEDs 100 vacuum-sucked on the grip surface of the grip member 1400 exist.

The outer periphery of the supporting portions 1300 provided on the upper surface of the non-grip region is configured in an extended manner to prevent the inflow of the outside air into the grip region. As a result, it is possible to block a factor that interferes with the vacuum pressure forming portions 10 from generating the vacuum pressure. In addition, it is possible to more effectively generate the grip force of the grip region by the vacuum pressure generated in the vacuum pressure forming portions 10.

The inner supporting portions 1300 are arranged in the multiple rows and columns, and the cross-shaped supporting portions 1300 are configured by intersecting the column supporting portions 1300a and the row supporting portions 1300b. An air passage 30 may be defined and formed between the supporting portion 1300 on the outer periphery and the inner cross-shaped supporting portions 1300 and between the inner cross-shaped supporting portions 1300. The air passage 30 formed between the supporting portions 1300 allows the vacuum pressure forming portions 10 to communicate with each other, the vacuum pressure forming portions 10 receiving the vacuum pressure that generates the grip force gripping the micro LEDs 100. Thus, the vacuum pressure applied to the porous member 1100 from the suction chamber 1200 is uniformly distributed in the vacuum pressure forming portions 10.

When gripping the micro LEDs 100 onto the grip surface of the grip member, a problem that the micro LEDs 100 are not gripped onto a part of the grip surface may occur. This is because the vacuum pressure transferred from the suction chamber is transferred to a part of the grip member in a concentrated manner such that the grip region where the grip force is not generated may exist. According to the present invention, since the air passage 30 is defined between the supporting portions 1300, the vacuum pressure transferred through the supporting portions 1300 from the porous member 1100 having the pores and positioned on and coupled to the grip member 1400 can be uniformly distributed to all the vacuum pressure forming portions 10 of the grip member 1400. Accordingly, it is possible to uniformize the grip force of the entire grip surface of the grip member 1400 and to improve the transfer efficiency of the grip surface of the grip member 1400 with respect to the micro LEDs 100.

The air passage 30 is not limited as long as the air passage 30 functions to connect the vacuum pressure forming portions 10 to each other. Since the support portion 1300 provided at the outer periphery of the upper surface of the non-grip region of the grip member 1400 is formed in an extended manner in order to block the outside air flowing into the vacuum pressure forming portions 10, it is preferable that the air passage 30 is formed between the inner supporting portions 1300 to allow the vacuum pressure forming portions 10 to communicate with each other.

As illustrated in FIG. 4, suction holes 20 may be formed in the vacuum pressure forming portions 10. The suction holes 20 are configured to have an inner diameter smaller than a horizontal length of an upper surface of each of the micro LEDs 100 so as to facilitate the generation of the vacuum pressure in the vacuum pressure forming portions 10, which generates the grip force for gripping the micro LEDs 100. The suction holes 20 may have the inner diameter smaller than the horizontal length of the upper surface of the micro LED 100, but is not limited thereto.

Figure 5:
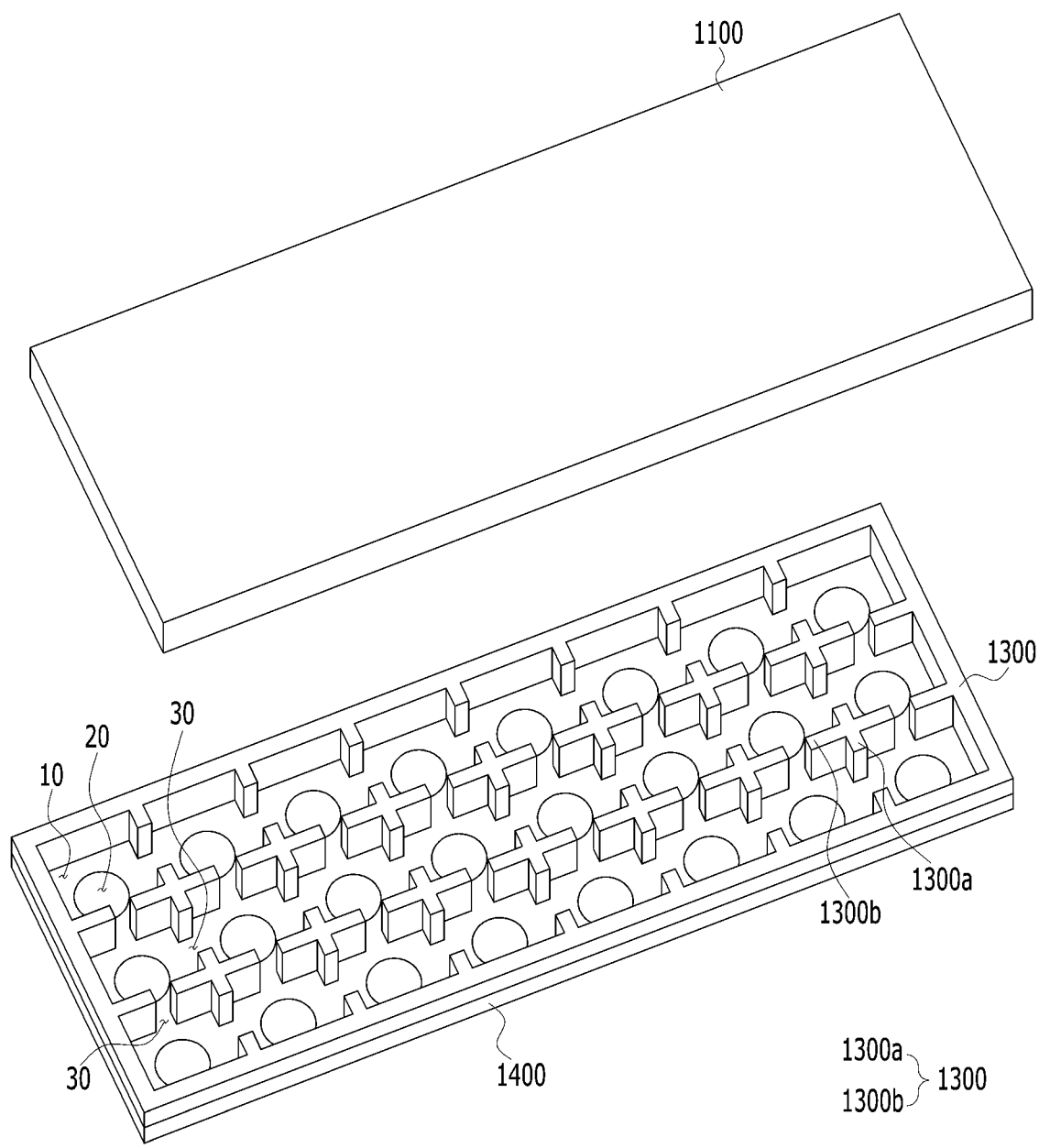
FIG. 5 is a perspective view illustrating the micro LED transfer head according to the first embodiment of the present invention.

FIG. 5 is a perspective view illustrating a state where the grip member 1400 provided with the supporting portions 1300 of the micro LED transfer head 1000 according to the first embodiment of the present invention and the porous member 1100 positioned on and coupled to the grip member 1400 via the supporting portions 1300 are separated from each other. As illustrated in FIG. 5, the porous member 1100 is positioned on and coupled to the grip member 1400 via the supporting portions 1300.

The porous member 1100, which has the pores and positioned on and coupled to the grip member 1400 via the supporting portions 1300, may be composed of a material containing a large number of pores therein, and may be configured as powders, a thin film, a thick film, or a bulk form having a porosity of about 0.2 to 0.95 in a predetermined arrangement or disordered pore structure. The pores of the porous member 1100 are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member 1100 are classified according to constituent components thereof: organic, inorganic (ceramic), metal, and hybrid type. The porous member 1100 may be embodied by one of the porous materials: organic, inorganic (ceramic), metal, and hybrid type porous materials.

The porous member 1100 is configured as powders, a coating film, or a bulk form. The powder may have various shapes such as a sphere, a hollow sphere, a fiber, and a tube. The powder may be used as it is in some cases, but it is also possible to prepare a coating film or a bulk form with the powder as a starting material.

The porous member 1100 may be embodied by a porous member having a disordered pore structure. In the case of the porous member 1100 having the disordered pore structure, disordered pores may be formed by laser, etching, or the like. Alternatively, the porous member 1100 may be embodied by a porous member having vertical pores. In this case, the vertical pores of the porous member 1100 may be formed by laser, etching, or the like as the disordered pores are.

When the pores of the porous member 1100 have the disordered pore structure, the multiple pores are connected to each other inside the porous member 1100 such that air flow paths are formed and connect upper and lower portions of the porous member 1100. When the pores of the porous member 1100 have the vertical pore structure, the inside of the porous member 1100 is pierced from top to bottom by the vertical pores such that air flow paths are formed.

As the porous member 1100 is positioned on and coupled to the grip member 1400 via the supporting portions 1300, the porous member 1100 is positioned between the grip member 1400 and the suction chamber 1200 and serves to transfer the vacuum pressure of the suction chamber 1200 to the grip member 1400. In this case, since the air passage 30 is formed between the supporting portions 1300 as described above, the vacuum pressure can be uniformly distributed to all the vacuum pressure forming portions 10 through the air passage 30, the vacuum pressure being transferred by the porous member 1100 coupled to the grip member 1400 via the supporting portions 1300. This prevents the vacuum pressure delivered from the porous member 1100 from concentrating on a part of the vacuum pressure forming portions 10 such that the grip force is generated in the entire grip region of the grip surface of the adsorption member 1400, so that the micro LEDs 100 can be gripped.

In the case that the grip member 1400 is embodied by a porous grip member having disordered pores or vertical pores or embodied by an anodic oxide film, the porous member 1100 may serve to support the grip member 1400 as the supporting portions 1300 do. In this case, the porous member 1100 may be embodied by a porous scaffold. A material of the porous member 1100 is not limited as long as the porous member 1100 made of the material functions to support the grip member 1400. The porous member 1100 may have the above-mentioned configuration of the porous member 1100. The porous member 1100 may be embodied by a rigid porous scaffold capable of preventing sagging at the center portion of the grip member 1400. For example, the porous member 1100 may be made of a porous ceramic material.

According to the above configuration, it is possible to grip the micro LEDs 100 with the uniform grip force and prevent sagging at the center portion of the grip member 1400.

A support plate may be positioned on and coupled to the grip member 1400. Although the support plate is not illustrated in the drawings, the support plate may be positioned on and coupled to the grip member 1400 via the supporting portions 1300 as the porous member 1100 is positioned on and coupled to the grip member 1400 via the supporting members 1300. The support plate may be made of a non-porous material. For example, the support plate may be made of a metal material.

The support plate made of the non-porous material may be provided with a suction passage. The suction passage is configured to be extended from top to bottom of the support plate. When the support plate is positioned on and coupled to the grip member 1400 via the supporting portions 1300, the suction passage allows the vacuum pressure applied by the suction chamber 1200 to be transferred to the vacuum pressure forming portions 10 so that the grip member 1400 generates the grip force. The suction passage may be configured to be extended from top to bottom at the center of the support plate, but the position where the suction passage is formed is not limited thereto. In addition, multiple suction passages may be formed to transfer the vacuum pressure of the suction chamber 1200. In the case that the support plate is positioned on and coupled to the grip member 1400 via the supporting portions 1300, the support plate may function to support the grip member 1400, prevent sagging at the center portion of the grip member 1400, and allow the vacuum pressure of the suction chamber 1200 to be transferred through the suction passage.

Figure 6:
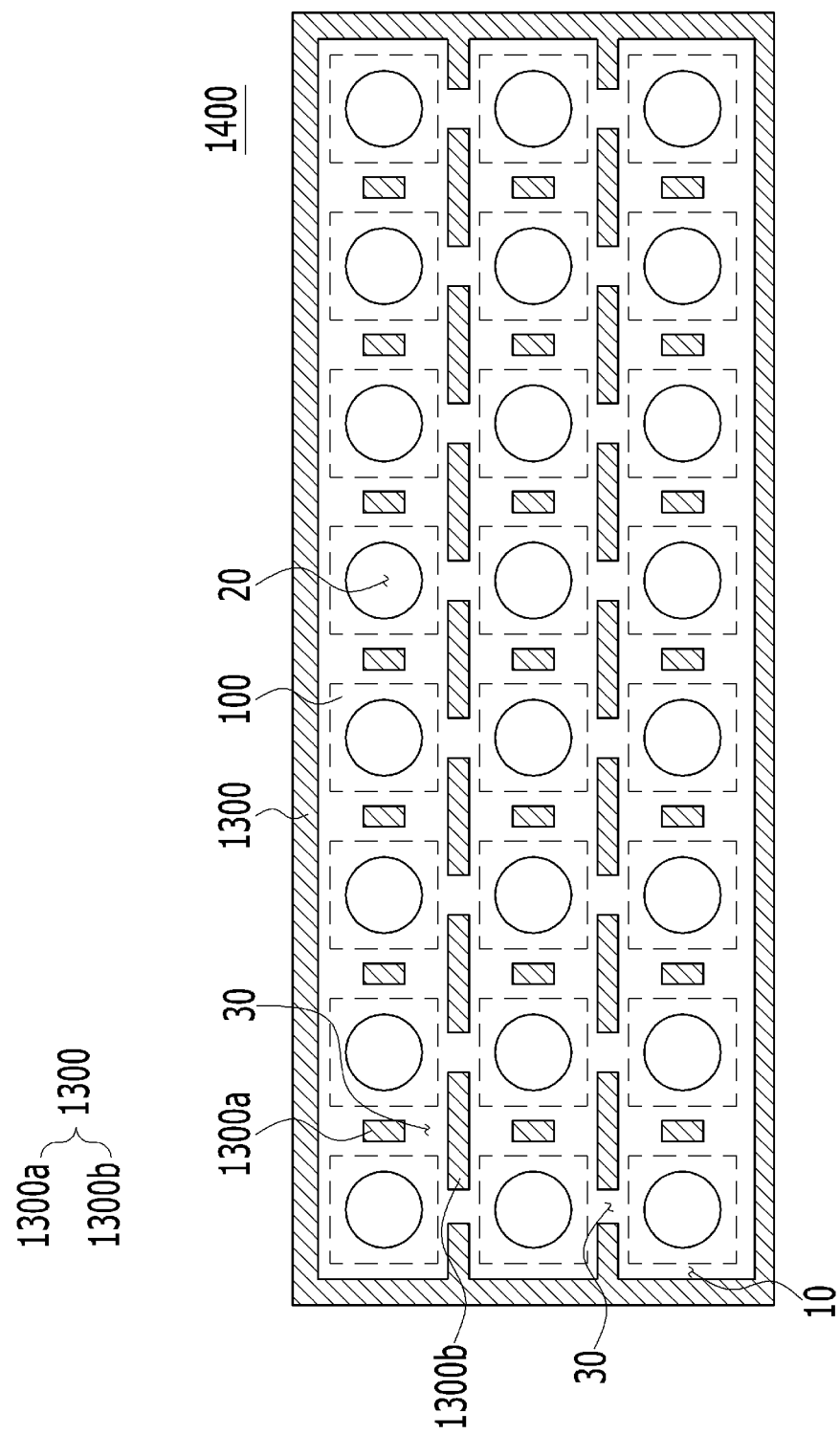
FIG. 6 is a top view illustrating a grip member of a modification of the micro LED transfer head according to the first embodiment of the present invention.

FIG. 6 is a top view illustrating a grip member 1400 of a modification of the micro LED transfer head 1000 according to the first embodiment of the present invention. The modification differs from the first embodiment in that an air passage 30 formed between supporting portions 1300 provided on an upper surface of a non-grip region of the grip member 1400 has a shape different from the air passage 30 of the first embodiment.

As illustrated in FIG. 6, the supporting portions 1300 are provided on the upper surface of the non-grip region where the micro LEDs 100 are not gripped. The supporting portions 1300 are provided on the upper surface of the non-grip region of the grip member 1400 and may be configured such that an outer periphery is formed in an extended manner and multiple rows and columns are arranged in the inner side surrounded by the outer periphery. Here, the outer periphery may indicate a region of the upper surface of the grip member 1400, which corresponds to an outer portion of a micro LED present area where the multiple micro LEDs 100 vacuum-sucked on the grip surface of the grip member 1400 exist.

The air passage 30 may be defined and formed between the outer supporting portion 1300 and the inner supporting portions 1300. The air passage 30 may be formed and interposed between column supporting portions 1300a and the row supporting portions 1300b, and formed and interposed between the row direction supporting portions 1300b located in the same row. Vacuum pressure forming portions 10 to which the vacuum pressure of the suction chamber 1200 is transferred communicate with each other by the means of the air passage 30. The vacuum pressure forming portions 10 communicating with each other through the air passage 30 can uniformly distribute the vacuum pressure applied by the suction chamber 1200 to the porous member 1100. Accordingly, a uniform grip force is generated in the entire grip region of the grip surface of the grip member 1400, thereby increasing the efficiency of transferring the micro LEDs 100.

Second Embodiment

Hereinbelow, a micro LED transfer head 1000 according to a second embodiment of the present invention will be described with reference to FIGS. 7A to 9B.

Figure 7A:
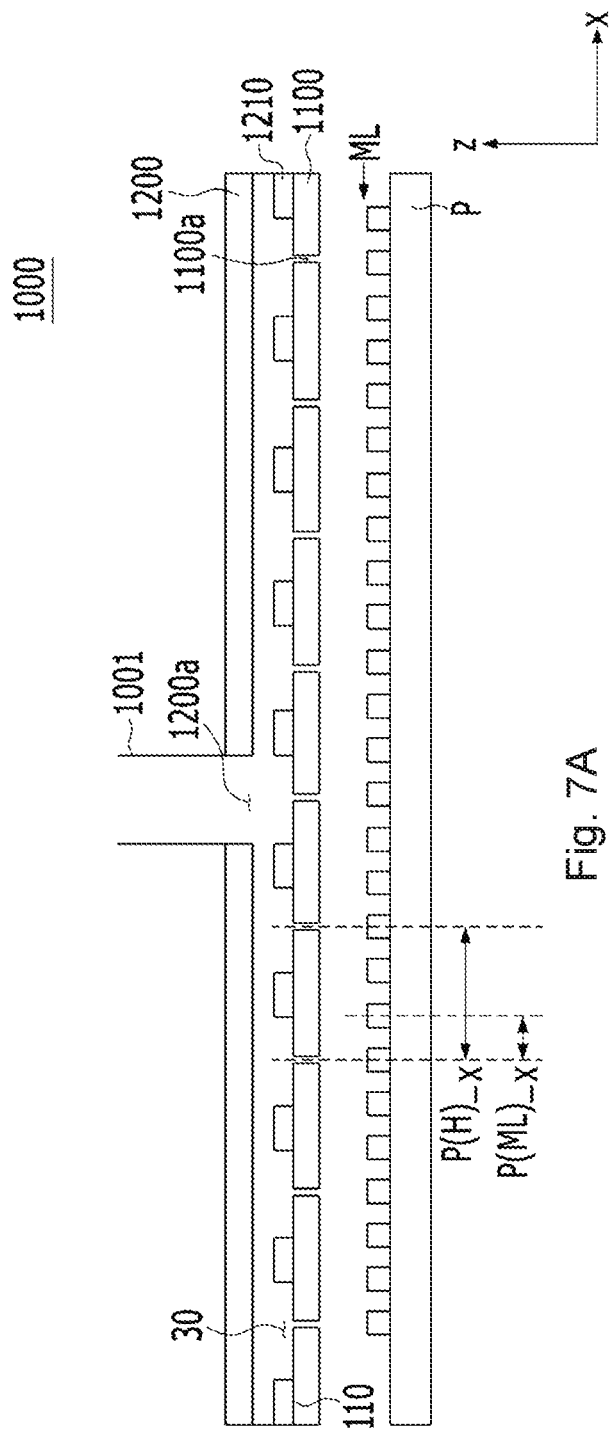
FIG. 7A and FIG. 7B are views illustrating a micro LED transfer head according to a second embodiment of the present invention.
Figure 7B:
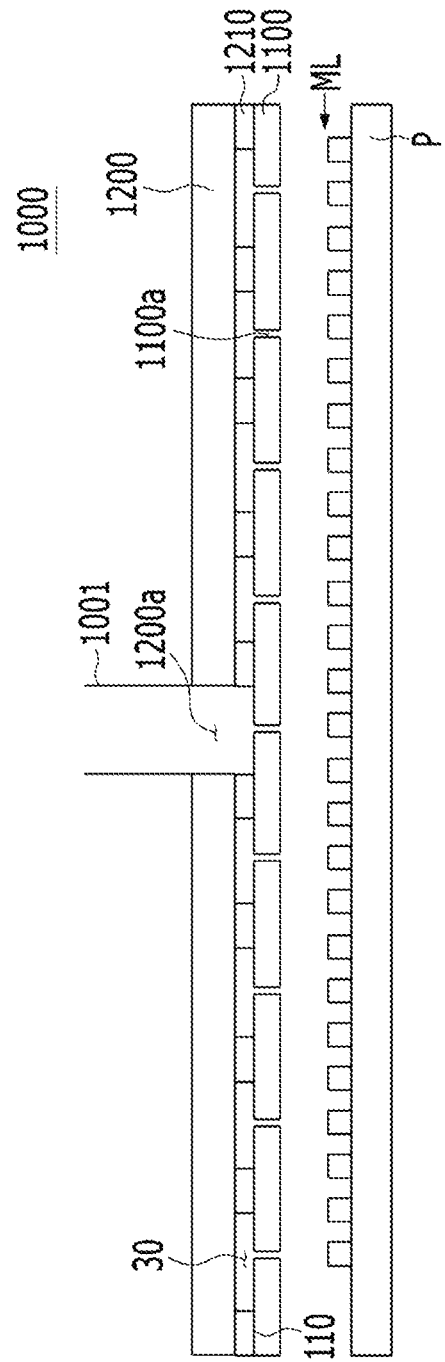

As illustrated in FIG. 7A and FIG. 7B, the micro LED transfer head 1000 includes: a grip member 1100; support members 1210 provided on an upper surface of the grip member 1100; and a communication member 1200 configured with a suction hole 1200a and coupled to the top of the support members 1210. The micro LED transfer head 1000 is configured such that vacuum pressure supplied from a vacuum pump (not illustrated) to the suction hole 1200a of the communication member 1200 is supplied through a pipe 1001, thereby generating vacuum pressure that is capable of gripping micro LEDs (referred to as ML in the drawings).

The grip member 1100 is embodied by a porous grip member having vertical pores 1100a. The vertical pores 1100a are formed to extend from top to bottom of the grip member 1100 using a laser, etching, or the like. The vertical pores 1100a formed in the grip member 1100 may be configured such that one vertical pore 1100a corresponds to one micro LED disposed on a substrate P or configured such that multiple vertical pores 1100a correspond to one micro LED disposed on the substrate P. Hereinbelow, the vertical pores 1100a formed in the grip member 1100 are configured such that one vertical pore 1100a corresponds to one micro LED disposed on the substrate P.

The grip member 1100 may be made of a material such as a metal, a non-metal, a ceramic, a glass, quartz, a silicone (PDMS), or a resin as long as the vertical pores 1100a can be formed to have a width of several tens of micrometers or less. In the case the grip member 1100 is made of a metal, it is possible to prevent the generation of static electricity during the transfer of the micro LEDs (ML). In the case the grip member 1100 is made of a non-metal, it is possible to minimize the influence of the grip member 1100 on the micro LEDs (ML) having the property of metal. In the case the grip member 1100 is made of a ceramic, a glass, quartz or the like, it is possible to secure rigidity and minimize a positional error due to a low thermal expansion coefficient thereof, which may occur due to thermal deformation of the grip member 1100 during the transfer of the micro LEDs (ML). In the case the grip member 1100 is made of a silicone (PDMS), it is possible to function as a buffer and minimize damage which may be caused by collision between a lower surface of the grip member 1100 and upper surfaces of the micro LEDs (ML). In the case the grip member 1100 is a resin, it is possible to facilitate the manufacture of the grip member 1100.

The grip member 1100 may be embodied by an anodic oxide film formed by anodizing a metal. The anodic oxide film is a film formed by anodizing a metal that is a base material, and pores of the anodic oxide film are formed in a process of forming the anodic oxide film by anodizing the metal. For example, in a case that the base metal is aluminum (Al) or an aluminum alloy, the anodization of the base material forms the anodic oxide film consisting of anodized aluminum ($Al_2O_3$) on a surface of the base material. The anodic oxide film formed as described above includes a barrier layer in which pores are not formed and a porous layer in which the pores are formed inside. The barrier layer is positioned on an upper portion of the base material, and the porous layer is positioned on the barrier layer. After removing the base material on which the anodic oxide film having the barrier layer and the porous layer is formed, only an anodic oxide film consisting of anodized aluminum ($Al_2O_3$) remains. The anodic oxide film has the pores configured vertically and having a regular arrangement with a uniform diameter. Accordingly, after removing the barrier layer, the pores have a structure extending from top to bottom vertically, thereby facilitating the generation of the vacuum pressure in the vertical direction.

The inside of the anodic oxide film forms air flow paths vertically by the vertical pores. An internal width of the pores has a size of several nanometers to several hundred nanometers.

When such anodic oxide film is etched by using a mask, vertical holes are formed at the etched portion. Unlike pores such as holes formed naturally in the anodic oxide film, the vertical holes are formed to have a large width, and the holes become the vertical pores 1100a of the porous grip member. In the case the anodic oxide film is used as the grip member 1100, it is possible to form the vertical pores 1100a in a z-axis direction by using reaction between the anodic oxide film and an etching solution.

The thermal expansion coefficient of the anodic oxide film is 2 ppm/° C. to 3 ppm/° C. Thus, it is possible to minimize the thermal deformation of the anodic oxide film caused by peripheral heat when the micro LED transfer head 1000 of the second embodiment grips and transfers the micro LEDs (ML), thereby lowering positional error remarkably.

The vertical pores 1100a formed in the grip member 1100 are spaced apart from each other in an x-direction (row direction) and a y-direction (column direction) at regular intervals. The vertical pores 1100a are spaced apart from each other in at least one of the x-direction and the y-direction at least two times a pitch distance of the micro LEDs (ML) disposed on the substrate P. Here, the substrate P may be the growth substrate 101 illustrated in FIG. 1 or may be the display substrate 301 illustrated in FIG. 2 where the micro LEDs (ML) gripped from the growth substrate 101 are transferred.

The micro LED transfer head 1000 provided with the grip member 1100 having the vertical pores 1100a descends toward the substrate P and selectively grips the micro LEDs (ML) existing at positions corresponding to the positions of the vertical pores 1100a. Here, each of the micro LEDs (ML) disposed on the substrate P may be any one of red, green, blue, and white LEDs. For example, the vertical pores 1100a formed in the grip member 1100 are spaced apart from each other at a distance three times the pitch distance of the micro LEDs (ML) disposed on the substrate P in the x-direction and a distance same with the pitch distance of the micro LEDs (ML) disposed on the substrate P in the y-direction. The micro LED transfer head 1000 selectively grips the micro LEDs (ML) disposed at predetermined distance in the x- and y-directions and moves multiple times (for example, three times) to transfer the micro LEDs (ML) to a carrier substrate or a temporary substrate to which the micro LEDs (ML) are transferred from the display substrate 301 or the growth substrate 101, thereby forming an 1×3 pixel array.

As the vertical pores 1100a are spaced apart from each other by a distance at least two times the pitch distance in the x- and y-directions of the micro LEDs (ML) disposed on the substrate P, pore-free portions 110 where the vertical pores 1100a are not formed are defined. The pore-free portions 110 may be provided with the support members 1210. As the vertical pores 1100a are spaced apart from each other by a distance of two times or more the pitch distance in the x- and y-directions of the micro LEDs (ML), the support members 1210 may be provided on the pore-free portions 110 defined between the vertical pores 1100a. The vacuum pressure supplied through the pipe 1001 is not transferred to the pore-free portions 110 such that a non-grip region is defined on the grip surface of the grip member 1100. In other words, since the vertical pores 1100a are spaced apart from each other, the pore-free portions 110 where the vertical pores 1100a are not formed are defined, and non-grip regions 120 of the grip surface defined by the pore-free portions 110 are provided with the support members 1210 at upper surfaces thereof. FIG. 7 illustrates that the vertical pores 1100a of the grip member 1100 is spaced apart from each other in the x-direction by a distance of two times or more the pitch distance in the x-direction of the micro LEDs (ML) disposed on the substrate P. Thus, the pore-free portions 110 provided with the support members 1210 may indicate the pore-free portions 110 of the grip member 1100 in the x-direction. Accordingly, the support members 1210 are provided on the upper surfaces of the non-grip regions 120 of the grip surface of the grip member 1100, which is defined by the pore-free portions 10, such that the support members 1210 may be provided on the upper surfaces of the non-grip regions 120 of the grip portion 1100 in the x-direction.

Figure 8:
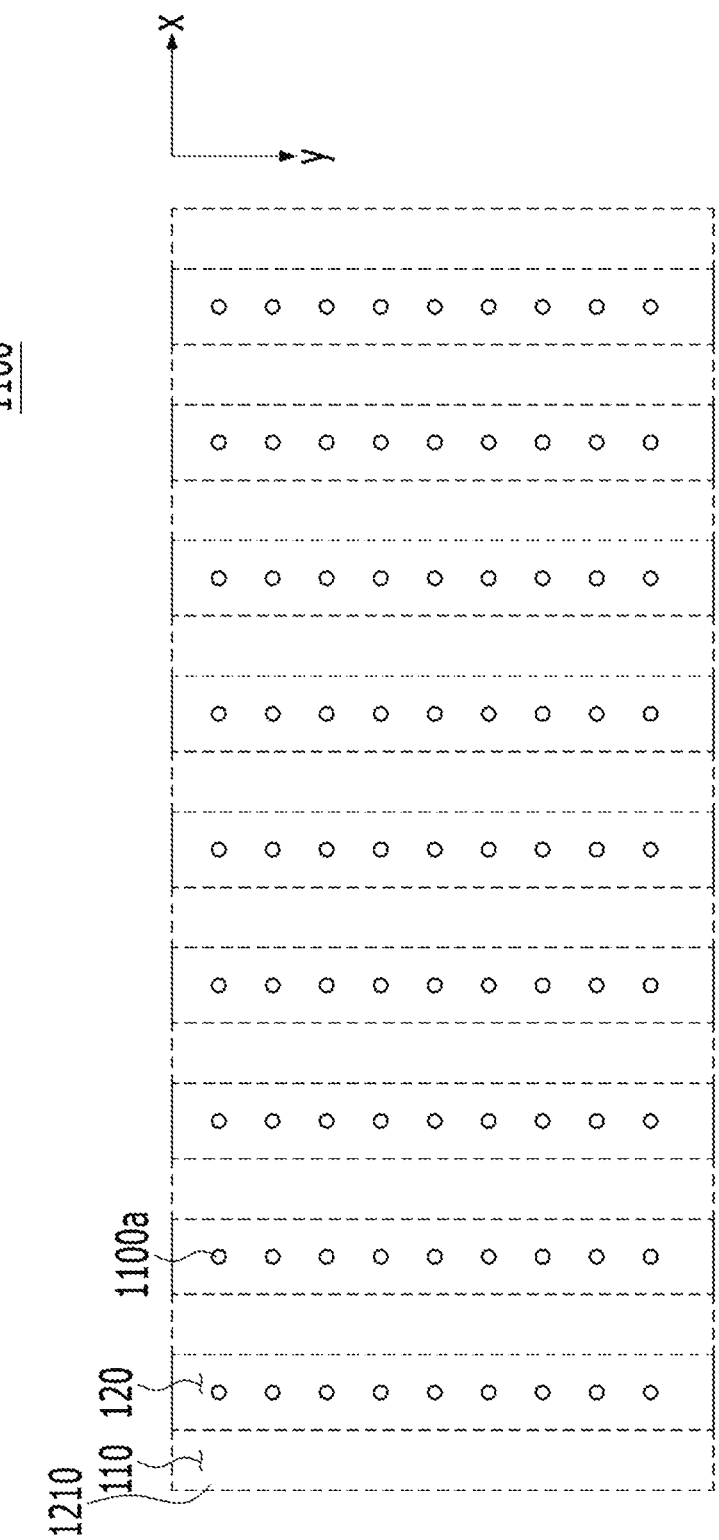
FIG. 8 is a bottom view illustrating a grip member of the micro LED transfer head according to the second embodiment of the present invention.

FIG. 8 is a bottom view illustrating the grip portion 1100. As illustrated in FIG. 8, the support members 1210 are provided between the vertical pores 1100a in the x-direction with respect to the vertical pores 1100a of the grip member 1100.

Figure 9A:
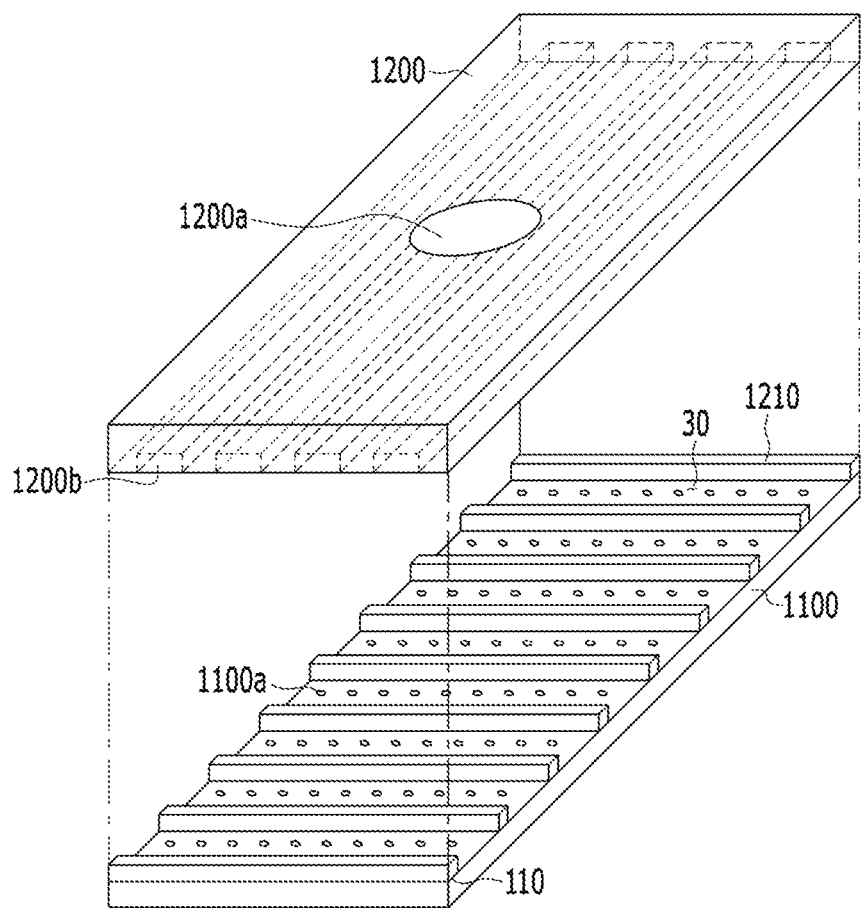
FIG. 9A and FIG. 9B are perspective views illustrating the micro LED transfer head according to the second embodiment of the present invention.
Figure 9B:
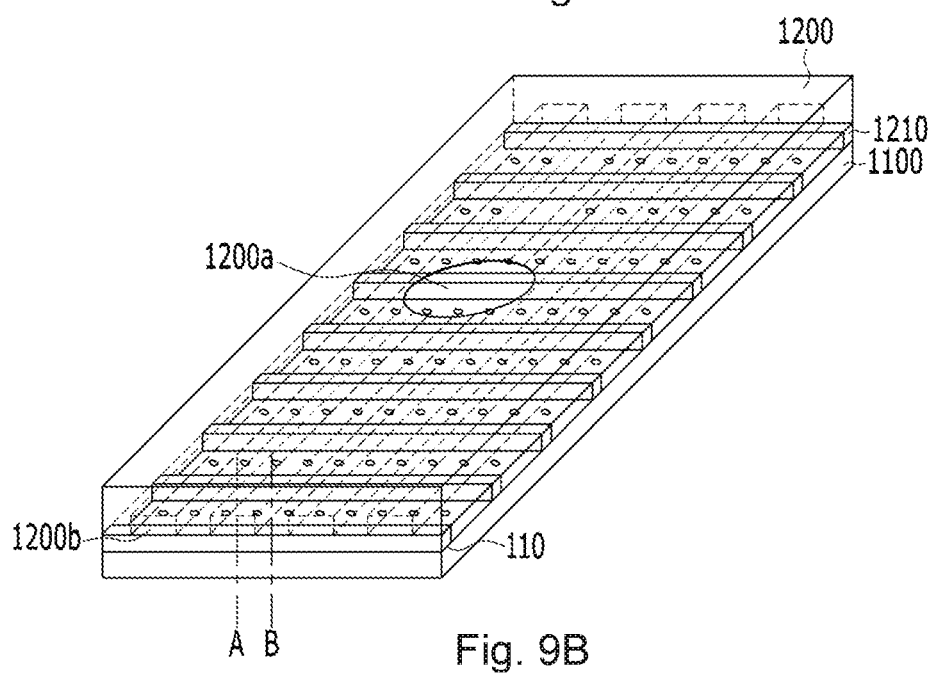

FIG. 9A is a view illustrating a state before the communication member 1200 to be positioned on and coupled to the grip member 1100 via the support members 1210 is coupled to the grip member 1100 of the micro LED transfer head 1000 according to the present invention; and FIG. 9B is a view illustrating a state where the communication member 1200 is positioned on and coupled to the grip member 1100 of the micro LED transfer head 1000 according to the present invention via the support members 1210.

Returning to FIG. 7A and FIG. 7B, FIG. 7A is a cross-sectional view taken along a line A of FIG. 9B, and FIG. 7B is a cross-sectional view taken along a line B of FIG. 9B. As illustrated in FIG. 7A, the micro LEDs (ML) are disposed on the substrate P at a pitch distance P(ML) in the x-direction. Correspondingly, the vertical pores formed in the grip member 1100 are spaced apart from each other by a distance P(H) in the x-direction. Here, the distance in the x-direction between the vertical pores 1100a is three times the distance between the micro LEDs (ML) disposed on the substrate P. The pore-free portions 110 defined by the vertical pores 1100a being spaced apart from each other in the x-direction may be provided with the support members 1210. The pore-free portions 110 may be the upper surfaces of the non-grip regions 120 of the grip member 1100. Therefore, the support members 1210 are provided on the upper surfaces of the non-grip regions 120 of the grip member 1100 in the x-direction.

Although not illustrated in the drawings, in the case the distance between the vertical pores 1100a in the y-direction is three times the distance between the micro LEDs (ML) disposed on the substrate P, the support members 1210 may be provided on the pore-free portions defined by the vertical pores 1100a being spaced apart from each other in the y-direction.

The support members 1210 are provided on the upper surfaces of the non-grip regions of the grip member 1100 and function to support the weight of the communication member 1200 positioned on and coupled to the support members 1210. Accordingly, although forming the vertical pores 1100a providing vertical air flow paths in the grip member 1100, it is possible to prevent deterioration of the rigidity of the grip member 1100. In detail, the grip member 1100 is thin in order to form the fine vertical pores 1100a therein by etching or using a laser. When the grip member 1100 is thin, it is difficult to support the weight of the communication member 1200 positioned on and coupled to the grip member 1100, the weight of the vacuum chamber supplying the vacuum pressure, or the like. Accordingly, since the support members 1210 are provided on the pore-free portions 110 according to the present invention, it is possible to support the weight of the communication member 1200 positioned on and coupled to the grip member 1100, and the weight of the vacuum chamber or the like. In addition, the support members 1210 may serve as a boundary that separates regions 30 between the support members 1210 where the vertical pores 1100a are formed from the pore-free portions 10. Thus, the support members 1210 may serve as a partition so that each of the regions 30 between the support members 1210 can serve as one vacuum pressure chamber. Accordingly, it possible to easily form a uniform vacuum pressure in the regions 30 defined between the support members 1210.

The communication member 1200 is provided on the support member 1210, the communication member 1200 being coupled to the support members 1210 and allowing the regions 30 defined between the support members 1210 to communicate with each other. The communication member 1200 may be made of a non-porous material such as a metal and configured with the suction hole 1200a. The suction hole 1200a is vertically penetrated through the communication member 1200. Thus, as the communication member 1200 is coupled to the top of the support members 1210, the pipe 1001 delivering the vacuum pressure supplied from the vacuum pump is connected to the suction hole 1200a. As a result, the vacuum pressure is supplied to the grip member 1100 so that the grip force can be generated.

The communication member 1200 is configured with recesses 1200b in a lower surface thereof, the recesses 1200b crossing the support members 1210. The recesses 1200b provided in the lower surface of the communication member 1200 may be configured to cross the supporting members 1210. Since the recesses 1200b crossing the support members 1210 are configured on the lower surface of the communication member 1200, the vacuum pressure supplied through the suction hole 1200a is uniformly distributed in the regions 30 defined between the support members 1210, thereby allowing the regions 30 to communicate with each other.

As illustrated in FIG. 7A, the recesses 1200b crossing the support members 1210 are configured on the lower surface of the communication member 1200 such that the regions 30 defined between the support members 1210 communicate with each other. As a result, the vacuum pressure supplied through the suction hole 1200a is distributed over the regions 30 defined between the support members 1210. The regions 30 between the support members 1210 may correspond to the upper surfaces of the grip regions 120 of the grip member 1100. As the vacuum pressure supplied through the suction hole 1200a is delivered to the vertical pores 1100a of the grip member 1100, the grip regions 120 of the grip member 1100 function thereby. Therefore, when the vacuum pressure is uniformly distributed through the suction hole 1200a to the entire regions 30 defined between the support members 1210 as the regions 30 communicate with each other, it is possible to generate the uniform grip force over the grip regions 120 of the grip member 1100. As a result, the micro LEDs (ML) can be transferred efficiently without a problem that the micro LEDs (ML) may not be gripped onto the grip surface of the micro LED transfer head 1000.

Although FIGS. 7A to 9B illustrate the multiple recesses 1200b, at least one recesses 1200b may be defined on the lower surface of the communication member 1200 so as to cross the support members 1210 such that the regions 30 defined between the support members 1210 communicate with each other. In addition, the recesses 1200b provided to cross the support members 1210 of the communication member 1200 may be configured to have a width and a thickness smaller than those of the communication member 1200 such that the regions 30 defined between the support members 1210 communicate with each other.

The communication member 1200 may be embodied by a porous member having pores.

The porous member may be composed of a material containing a large number of pores therein, and may be configured as powders, a thin film, a thick film, or a bulk form having a porosity of about 0.2 to 0.95 in a predetermined arrangement or disordered pore structure. The pores of the porous member are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member are classified according to constituent components thereof: organic, inorganic (ceramic), metal, and hybrid type. The porous member is configured as powders, a coating film, or a bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member have a disordered pore structure, the multiple pores are connected to each other inside the porous member such that flow paths are formed and connect upper and lower portions of the porous member. The porous member may become porous by sintering aggregate composed of inorganic granules and a binder that bonds aggregate. In this case, the multiple pores of the porous member are irregularly connected to each other to form gas flow paths, and the top and bottom surfaces of the porous member communicate with each other by the gas flow paths.

In the case the communication member 1200 is embodied by a porous member having pores, the communication member 1200 may function to support the grip member 1100 as the support members 1210 does. In this case, the communication member embodied by the porous member may be a porous scaffold. A material of the porous member is not limited as long as the porous member made of the material functions to support the grip member. The porous member may have the above-mentioned configuration of the porous member. The communication member 1200 may be embodied by a porous member, specifically, a rigid porous ceramic scaffold capable of preventing sagging at the center portion of the grip member 1100.

In the case the communication member 1200 is the porous member having pores, a vacuum chamber (not illustrated) is coupled to an upper portion of the communication member 1200. The vacuum chamber is connected to the pipe 1001 such that the vacuum pressure supplied from the vacuum pump can be delivered to the pores of the communication member 1200. The vacuum pressure applied to the pores of the communication member 1200 through the vacuum chamber is delivered to the grip member 1100. In this case, it is possible to deliver the vacuum pressure to the regions 30 through the pores of the communication member 1200, the regions 30 being defined between the support members 1210 provided on the upper surface of the grip member 1100. As a result, the grip force is generated in the grip regions 120 of the grip member 1100, so that the micro LEDs (ML) can be gripped onto the grip surface of the grip member 1100.

Recesses 1200b crossing the support members 1210 may be configured in a lower surface of the communication member 1200 embodied by the porous member having the pores. The vacuum pressure delivered by the vacuum chamber is delivered to the pores of the communication member 1200. The vacuum pressure delivered to the pores can be uniformly distributed to the regions 30 defined between the support members 1210 communicating with each other through the recesses 1200b configured in the lower surface of the communication member 1200 and crossing the support members 1210. Accordingly, the uniform grip force is generated over the grip regions 120 and all of the micro LEDs (ML) can be transferred to the grip surface without fail.

As described above, the present invention has been described with reference to the embodiments. However, those skilled in the art will appreciate that various modifications, additions and substitutions are possible, without departing from the scope and spirit of the invention as disclosed in the accompanying claims.

What is claimed:

1. A micro LED transfer head, comprising:
a grip member having a hole and being configured to grip a micro LED through the hole;
a supporting portion provided on an upper surface of a non-grip region of the grip member where the micro LED is not gripped;
a porous member having pores, the porous member being positioned on and coupled to the supporting portion;
a vacuum pressure forming portion defined by the supporting portion and provided between the porous member and an upper surface of a grip region of the grip member where the micro LED is gripped,
wherein the hole of the grip member communicates with the vacuum pressure forming portion, and
wherein the grip member is an anodic oxide film formed by anodizing a metal, and
wherein the supporting portion includes a row supporting portion and a column supporting portion that intersect with each other.

2. The micro LED transfer head of claim 1, wherein the grip member is a porous grip member.

3. The micro LED transfer head of claim 1, wherein the grip member is a porous grip member having disordered pores.

4. The micro LED transfer head of claim 1, wherein the grip member is a porous grip member having vertical pores.

5. A micro LED transfer head, comprising:
a grip member being a porous grip member that has vertical pores, the grip member being configured to grip a micro LED through at least one of the vertical pores;

support members provided on an upper surface of a non-grip region of the grip member where the micro LED is not gripped;

a communication member being a porous member that has pores, the communication member being positioned on and coupled to the support members;

regions each defined by an adjacent pair of the support members and provided between the communication member and an upper surface of a grip region of the grip member where the micro LED is gripped, wherein the vertical pores of the grip member communicate with the regions; and a recess provided in a lower surface of the communication member, wherein the recess crossing the support members makes the regions communicate with each other, and wherein the grip member is an anodic oxide film formed by anodizing a metal.

6. The micro LED transfer head of claim 5, wherein the communication member is provided with a suction hole.

7. The micro LED transfer head of claim 5, wherein the communication member is coupled at an upper portion thereof to a vacuum chamber.

* * * * *